United States Patent [19]
Davis et al.

[11] Patent Number: 6,144,093
[45] Date of Patent: Nov. 7, 2000

[54] COMMONLY HOUSED DIVERSE SEMICONDUCTOR DIE WITH REDUCED INDUCTANCE

[75] Inventors: Christopher Davis, Thousand Oaks, Calif.; Glynn Connah, Glossop, United Kingdom

[73] Assignee: International Rectifier Corp., El Segundo, Calif.

[21] Appl. No.: 09/070,097

[22] Filed: Apr. 27, 1998

[51] Int. Cl.⁷ .................................................. H01L 23/34
[52] U.S. Cl. .......................... 257/723; 257/724; 257/773
[58] Field of Search .................................. 257/109, 288, 257/368, 401, 723, 773, 901, 331, 666, 685, 724

[56] References Cited

U.S. PATENT DOCUMENTS

| | | | |
|---|---|---|---|
| 5,083,189 | 1/1992 | Sawaya | 257/685 |
| 5,084,753 | 1/1992 | Goida et al. | 257/666 |
| 5,200,640 | 4/1993 | Scheftic et al. | 257/693 |
| 5,332,921 | 7/1994 | Dousen et al. | 257/685 |
| 5,544,038 | 8/1996 | Fisher et al. | 363/147 |
| 5,814,884 | 9/1998 | Davis et al. | 257/723 |

*Primary Examiner*—John Guay
*Assistant Examiner*—Alonzo Chambliss
*Attorney, Agent, or Firm*—Ostrolenk, Faber, Gerb & Soffen, LLP

[57] ABSTRACT

A MOSFET die and a Schottky diode die are each mounted within a device package on a common lead frame pad with their drain and cathode terminals, respectively, connected together at the common pad. The source terminal of the MOS gated device and the anode terminal of the Schottky diode are each electrically connected by wire bonds to an insulated pin, and the gate electrode of the MOS gated device is electrically connected by wire bonds to another pin. A redundant wire connection runs from the source terminal of the MOS gated device to the anode terminal of the Schottky diode reduce the inductance in the anode lead.

18 Claims, 5 Drawing Sheets

COMMONLY HOUSED DIVERSE SEMICONDUCTOR DIE WITH REDUCED INDUCTANCE

BACKGROUND OF THE INVENTION

This invention relates to semiconductor devices and, more specifically, relates to a novel device in which a plurality of die, which may be of diverse size and of diverse junction pattern, are fixed to a common lead frame and within a common package or housing and are interconnected with reduced inductance.

When MOSFETs, or other MOS gated semiconductor devices, are used in switching applications in which the gate of the device is repeatedly turned on and off, transient currents can flow through the body diode of the device when the device is turned off, increasing the turnoff time of the device. It is therefore advantageous to place a Schottky diode in parallel with and oriented in the direction of the body diode to provide a faster path for the flow of transient currents. The Schottky thus prevents the body diode from conducting because the Schottky generally has a lower forward voltage drop than the body diode. Typically, the Schottky has a forward voltage drop of about 0.4 V, whereas the body diode typically has a forward voltage drop of 0.7 V.

Other electrical circuits, such as DC to DC converters, synchronous converters, and the like also require a number of semiconductor components such as MOS gated semiconductor devices and Schottky diodes. The MOS gated device and the Schottky diode are generally separately housed and individually mounted on a support board. The separately housed parts therefore take up board space and, as each part generates heat, can interfere with other nearby mounted components, such as microprocessors. It is thus desirable to reduce the board space and the part count and assembly cost by mounting the MOS gated device and the Schottky diode on a common lead frame. In this arrangement, each of the devices has a first power terminal that is electrically connected to the main pad area of the lead frame which has an externally available pin to connect to the main pad area. The die are also provided with one or more additional power terminals at the top of each die which are connected to respective external pins of the lead frame and which are isolated from one another. Such a device is disclosed in U.S. application Ser. No. 08/816,829, filed on Mar. 18, 1997 now U.S. Pat. No. 5,814,884, which is incorporated herein by reference.

When the MOSFET and the Schottky diode are mounted in a commonly housed lead frame as described above, the drain terminal of the MOSFET and the cathode terminal of the Schottky diode typically contact the main pad area. In a T0220 package, for example, the main pad area is integral with the central pin, and a bonding wire connects the gate terminal atop the MOSFET to another of the pins. Additional bonding wires connect the MOSFET source pad area and the Schottky diode anode pad to a third external pin.

This arrangement results in an undesired inductance in the lead that connects the anode of the Schottky to the source pin of the device and which increases the time required for the transient currents to die down, thereby causing switching losses.

It is therefore desirable to provide a co-packaged device without this inductance.

SUMMARY OF THE INVENTION

The present invention reduces the conductive path length between the anode terminal of the Schottky diode and the source terminal of the MOS gated device by adding a redundant bonding wire between the two terminals, thereby reducing the inductance between the anode of the body diode and the anode of the Schottky diode. As a result, switching losses are reduced.

In accordance with the invention, a semiconductor device includes a conductive lead frame that has a main pad area with at least one integral pin that extends from its edge and with at least two pins that are separated from one another and from the main pad area. First and second semiconductor die each have a first electrode on one surface and at least a second electrode on an opposite surface. The first electrodes of the die are each disposed atop and are in electrical contact with the main pad area and are laterally spaced from one another. The second electrodes of the die are both wire bonded to a respective one of the pins within the housing. The second electrodes are also electrically connected directly to each other.

In accordance with another aspect of the invention, a T0220 package includes a conductive lead frame as described above. A first semiconductor die includes an MOS gated semiconductor device with a drain electrode on one surface and source and gate electrodes on an opposite surface. A second die includes a Schottky diode whose cathode is on one surface and whose anode is on an opposite surface. The drain electrode of the MOS gated device and the cathode electrode of the Schottky diode are arranged on top, and in electrical contact with, the main pad area and are laterally spaced from one another. The source electrode of the MOS gated device in the anode of the Schottky diode are wire bonded to one of the isolated pins. The source and anode electrodes are electrically connected directly to each other.

According to yet another aspect of the invention, a converter circuit includes a semiconductor device as described above. A further MOS gated device has a drain terminal electrically coupled to a supply voltage and a source terminal electrically coupled to the drain terminal of the MOS gated device of a semiconductor device and is also coupled to the cathode terminal of the Schottky diode. A ground terminal is electrically coupled to the source terminal of the MOS gated device of the semiconductor device and to the anode terminal of the Schottky diode. A controller is coupled to each of the gates of the two MOS gated devices.

Other features and advantages of the present invention will become apparent from the following description of the invention which refers to the accompanying drawings.

DETAILED DESCRIPTION OF THE INVENTION

Figure 1A:
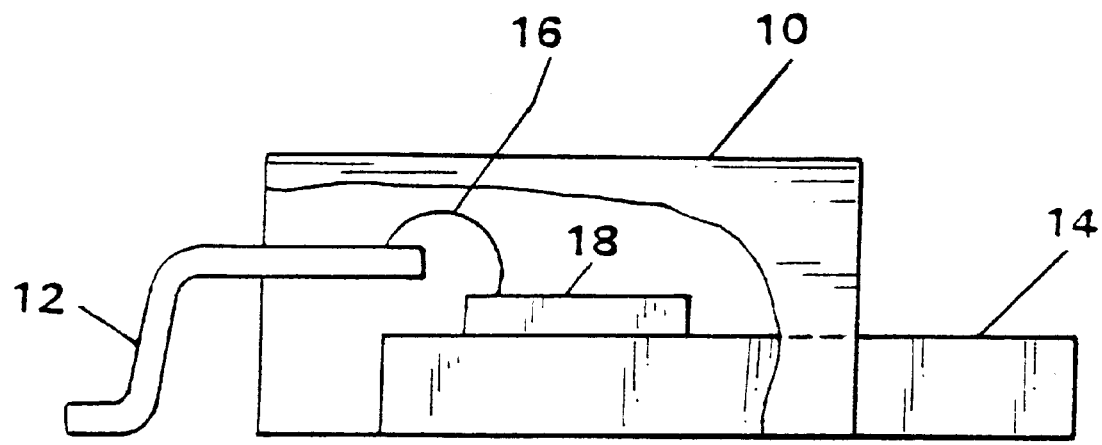
FIGS. 1A and 1B show a cutaway side view and a top view of a known T0220 style package which can be used to house both a MOSFET and a Schottky die.
Figure 1B:
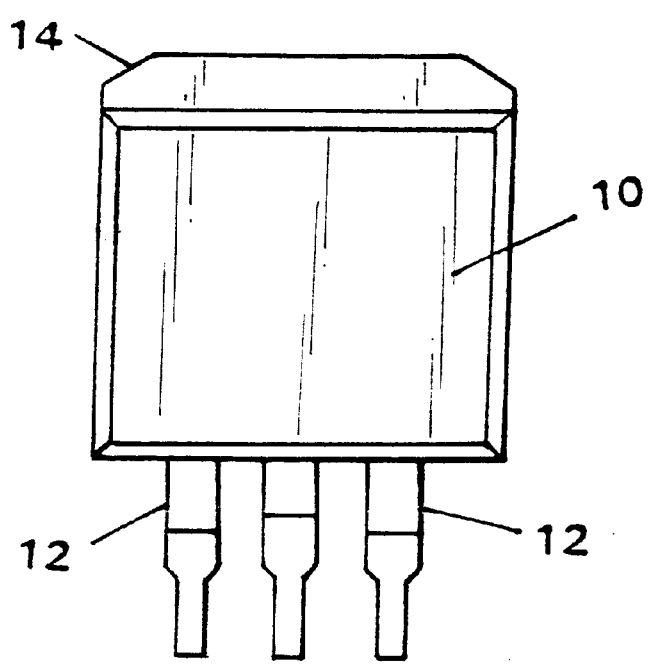

Referring first to FIGS. 1A and 1B, there is shown a known surface mounted T0220 package 10 illustrated in cutaway side and top views, respectively. The bottom surface of one or more semiconductor devices 18 is soldered, glued or otherwise attached to a metal plate 14 of the package. The plate 14 may also provide thermal contact with the devices as well as an electrical connection. Upper, opposing surfaces of the devices are connected to one or more of the lead terminals 12 by wire bonds 16. Another of the lead terminals (not shown) may be integral with the plate 14. The device 18 and a portion of the lead terminals and plate are encapsulated in a package body, typically formed of resin.

Figure 2:
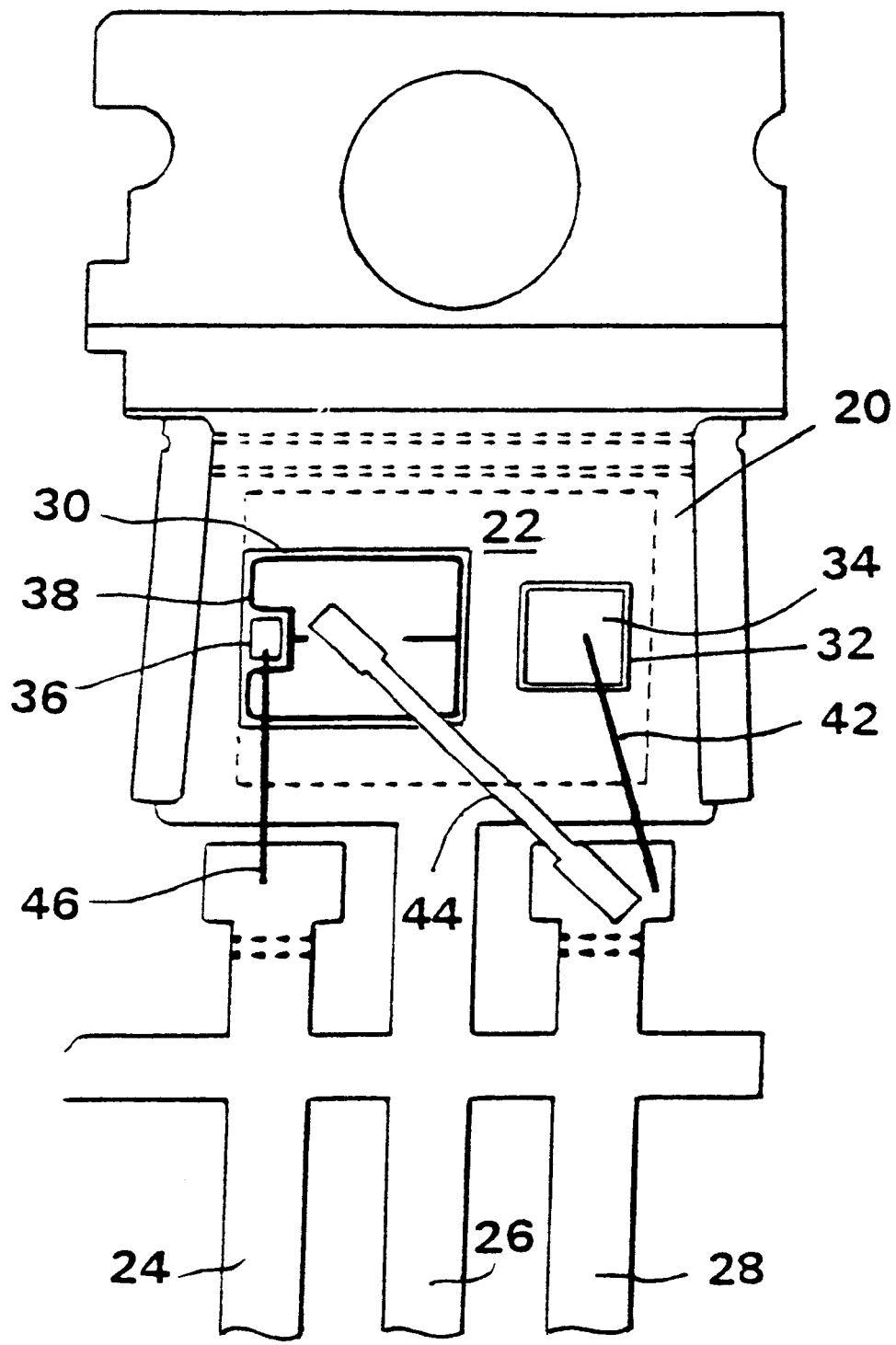
FIG. 2 shows a top view of the lead frame of a T0220 style package in which the MOSFET and Schottky die are connected in a known manner.

FIG. 2 shows a top view of a T0220 lead frame 20 upon which a MOSFET 30 and a Schottky diode 32 are co-packaged within a common housing. The lead frame 20 is provided with a main pad body 22 from which integral pin 26 extends. Also provided are pins 24 and 28 which are originally integral with the main pad body 22 during molding but are subsequently severed to electrically isolate pins 24 and 28 from one another and from the main pad area 22, as shown in FIG. 1B. The lead frame 20 is a conductive lead frame and may have a conventional lead frame solder finish.

The bottom (cathode) surface of Schottky diode 32 and the bottom (drain) surface of MOSFET 30 are electrically connected to the main pad area 22, such as by a conductive epoxy die attached compound, and are thus connected to pin 26. Alternatively, the cathode surface of Schottky diode 22 and the drain surface of MOSFET 30 are soldered to the main pad area 22 or are connected to the main pad area using a conductive glass containing silver particles.

A top (source) electrode 38 of the MOSFET 30 and the top (anode) electrode 34 of the Schottky diode 32 are wire bonded by bonding wires 42 and 44, respectively, to source pin 28. Another top (gate) electrode 36 is wire bonded by bonding wire 46 to the gate pin 24. Aluminum bonding wires are most commonly used and the internal bonding extensions of the pins 24 and 28 are typically nickel plated. The bonding wires are generally bonded to the die surface and to the internal bonding extensions using ultrasonic wedge bonding, as is known in the art, though other processes may be used.

A molded housing, as shown in FIGS. 1A and 1B, is formed around the lead frame 20 in a conventional molding operation using an anhydride mold compound such as Dexter Hysol MG15F, though mold compounds such as novolac, biphenol or other compounds may be used. Other types of housings, such as ceramic, hermetic or injection molded metal, may be used.

The known co-packaged MOSFET and Schottky diode shown in FIG. 2 has the disadvantage that an inductance is present in the wire bond 42 that is located between the anode 34 of the Schottky diode 32 and the extension of the source pin 28. This inductance has the undesired effect of slowing down the time needed to sweep out minority carriers from the MOSFET 30 when the MOSFET 30 is shut off and thus the time required for reverse recovery.

Figure 3:
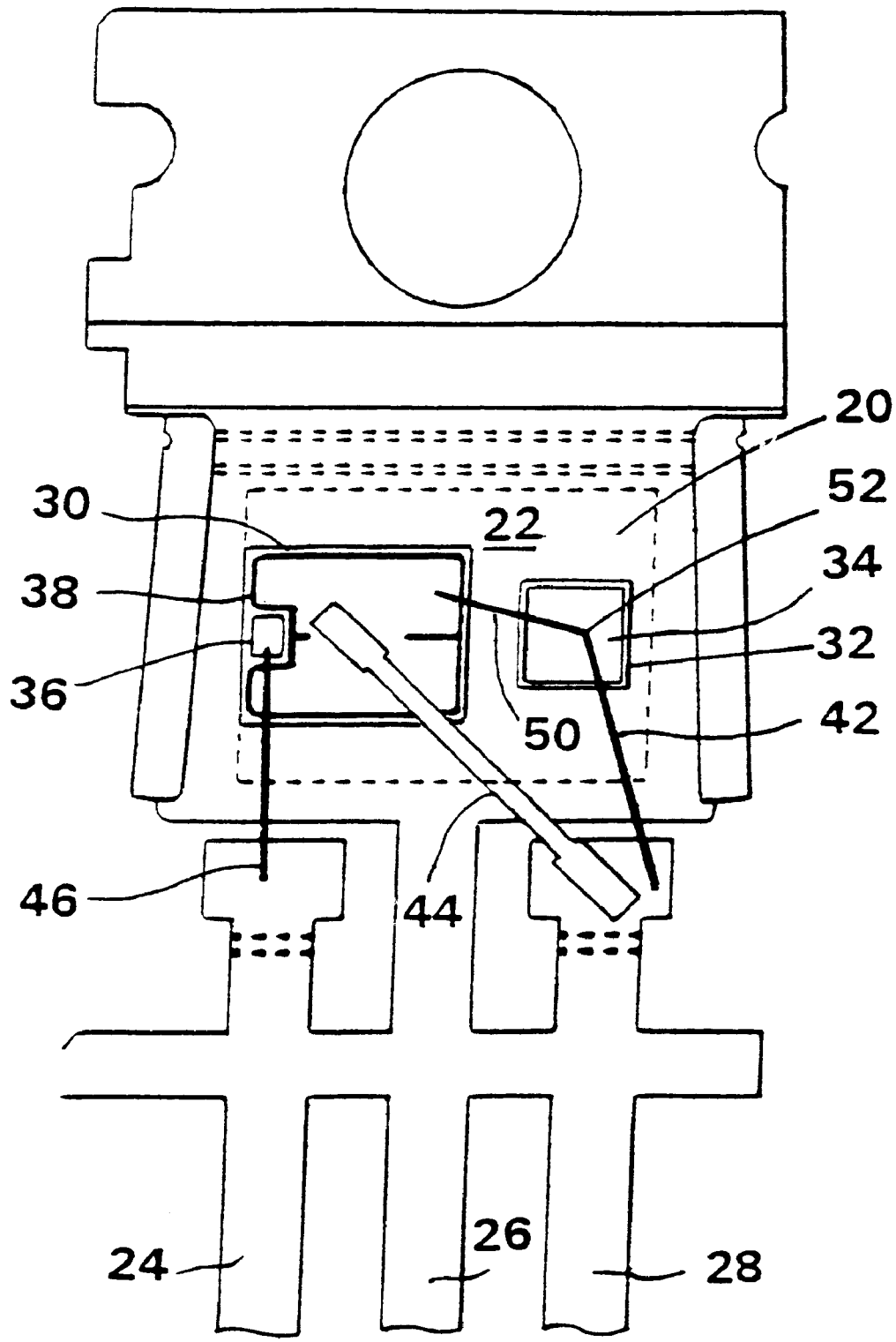
FIG. 3 shows a top view of the lead frame of a T0220 style package in which the MOSFET and the Schottky die are interconnected according to a first embodiment of the invention.

In accordance with the invention, an extra, redundant wire 50 directly connects the anode terminal 34 of the Schottky 32 and the source terminal 38 of the MOSFET 30, as shown in FIG. 3. The added wire 50 reduces the inductance present between the source pin and the anode electrode. Typically, the added wire 50 is a stitch bond.

Figure 4:
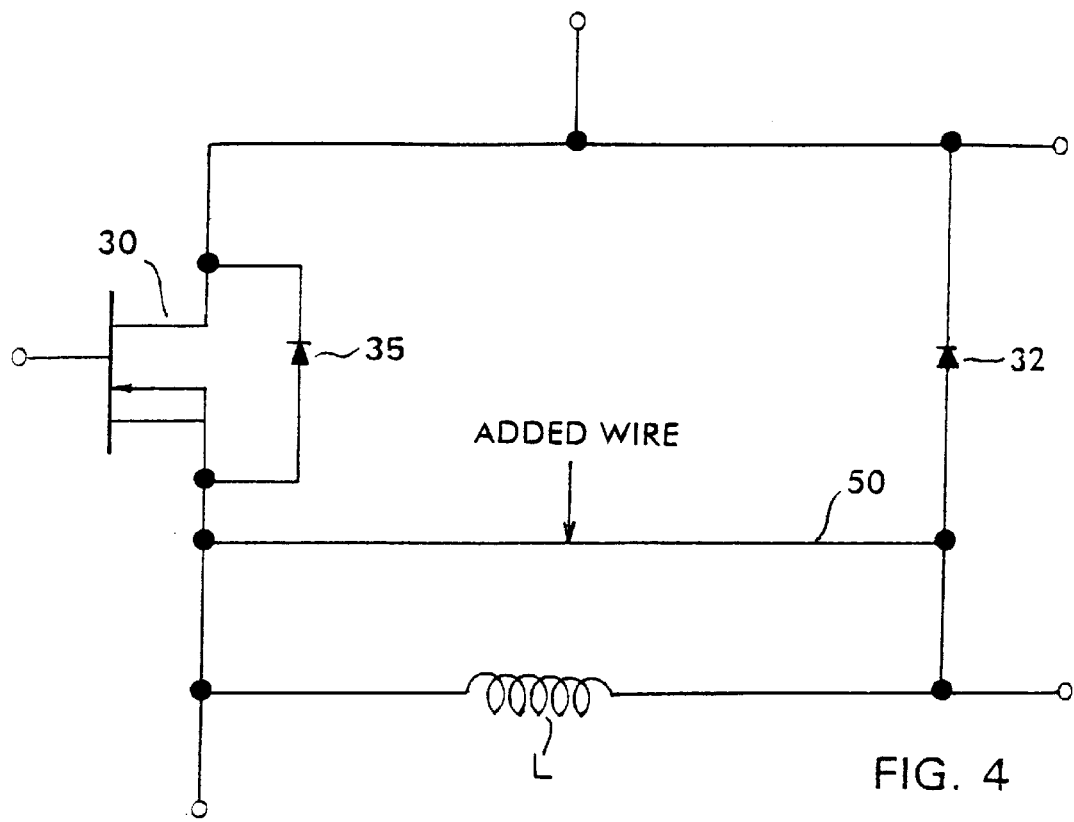
FIG. 4 is a circuit diagram of the package of FIG. 5.

FIG. 4 illustrates the circuit formed by the co-packaged vertical conduction MOSFET 30 and the Schottky diode 32 of the invention. The drain of the MOSFET 30 is connected to the high side and its source is connected to the low side. An inherent body diode 35 is present between the source and drain of the MOSFET 30 and is oriented as shown. The Schottky diode is arranged in parallel with and with the same polarity as the body diode 35 so that when the MOSFET 30 is shut off during switching, the lower forward voltage drop Schottky diode 32 provides a fast path for the flow of transient currents caused by minority carriers that are swept out from the MOSFET during reverse recovery. In known circuits as shown in FIG. 2, however, an inductance L is present in the wire bond which connects the anode of Schottky diode 32 to the low side terminal. Thus, an added wire bond 50, in accordance with the invention and shown in FIG. 3, shorts out the inductance L and provides a shorter conduction path from the source of MOSFET 30 to the anode of Schottky diode 32.

Figure 5:
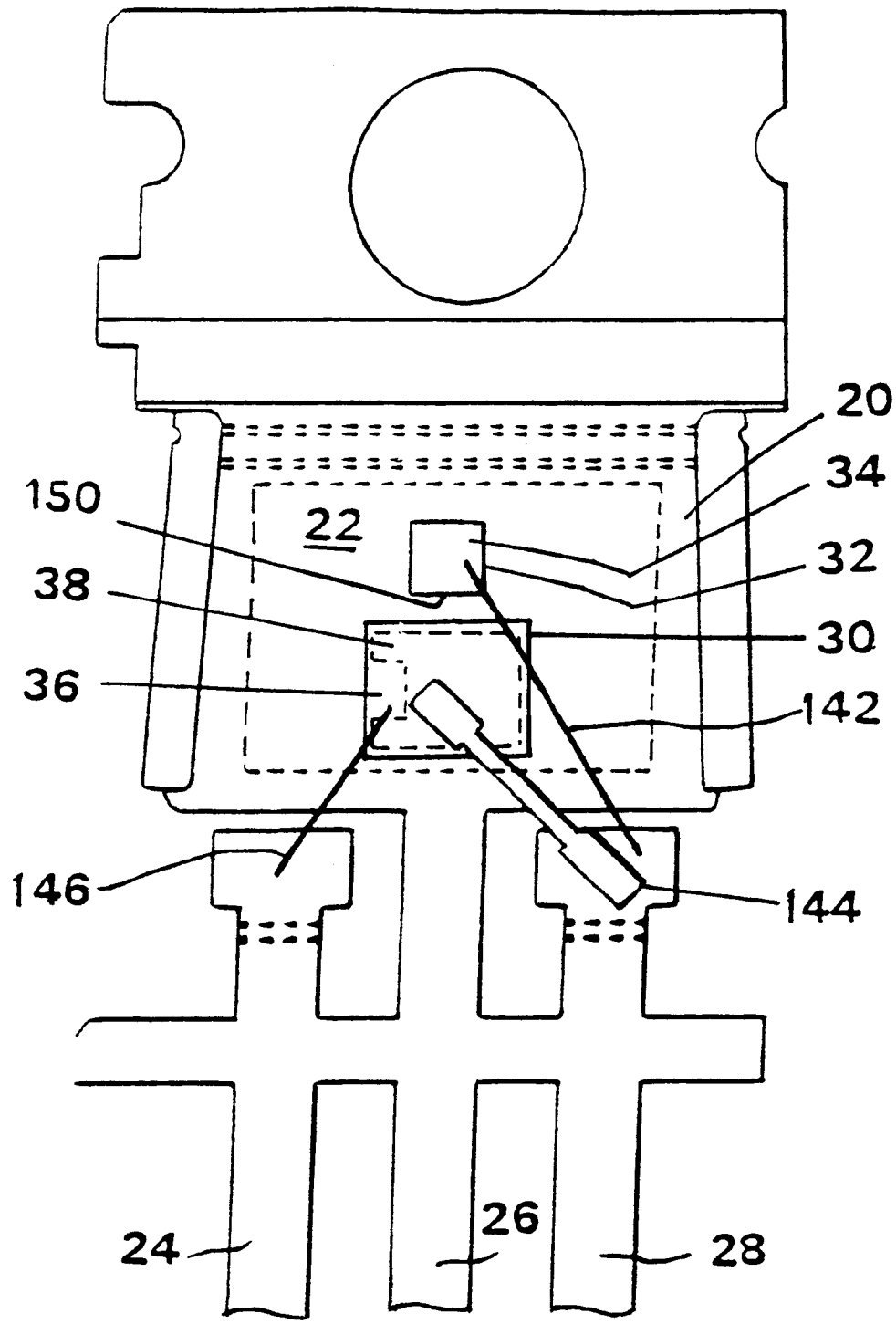
FIG. 5 shows a top view of a lead frame in which the MOSFET and Schottky die are interconnected according to a second embodiment of the invention.

FIG. 5 shows an alternative embodiment of the invention in which the source terminal 38 of MOSFET 30 and the cathode terminal 34 of Schottky diode 32 are connected by wire bonds 142 and 144, respectively, to isolated pin 28, and the gate terminal 36 of MOSFET 30 is connected by wire bond 146 to pin 24. An added wire bond 150, in accordance with the invention, directly connects the source terminal of the MOSFET to the anode terminal of the Schottky diode and shortens the conduction path, thereby reducing the inductance L in the manner shown in FIG. 4.

It should be noted that MOSFET 30 of FIGS. 3, 4 and 5 may be a 30V, 35 m-ohm die which is available from International Rectifier Corporation.

It should also be noted that other package styles, such as a known housing type SO-8 surface mount housing or other in-line packages, may be used with the invention.

Figure 6:
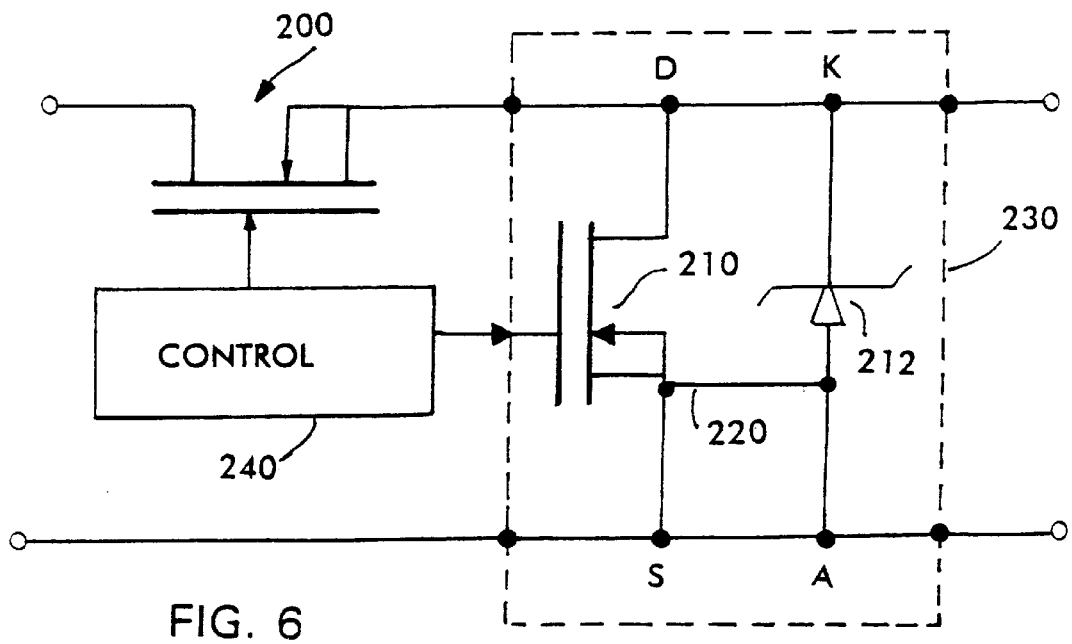
FIG. 6 is a circuit diagram of a buck converter circuit which incorporates the package of the present invention.

FIG. 6 shows an example of a circuit which uses the reduced inductance, co-packaged MOSFET and Schottky diode of the invention. In this example, a synchronous buck converter circuit uses an N channel MOSFET 200 as the switching device. MOSFET 210 and Schottky diode 212, which are co-packaged in housing 230, are arranged in parallel for synchronous rectification. The letters D, S, K and A designate the Drain of MOSFET 210; the source of MOSFET 210; the cathode of diode 212 and the anode of diode 212 respectively. As noted above, this arrangement eliminates the effect of the inherent body diode of the vertical conduction MOSFET 210 from the circuit because the Schottky diode 212 handles the reverse current flow seen by the synchronous rectifier during the "wait" state of the controller 240.

According to the invention, an added wire 220 connects the source of MOSFET 210 directly to the anode of Schottky diode 212 in the manner described above, thereby reducing the inductance present between the anode of Schottky diode 212 and the ground terminal.

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

What is claimed is:

1. A semiconductor device comprising:
   a conductive lead frame having a main pad section with at least one integral pin extending from an edge thereof and having at least two pins separated from one another and from said main pad area;
   a first semiconductor die having a first electrode on one surface and at least a second electrode on an opposite surface; and a second semiconductor die having a first electrode on one surface and at least a second electrode on an opposite surface;

said first electrodes of said first and second die being disposed atop and in electrical contact with said main pad area and being laterally spaced from one another;

said second electrode of said first die being connected by a wire bond to a respective one of said at least two pins, and said second electrode of said second die being connected to said respective pin by another wire bond;

said second electrodes of said first and second die having a further electrical connection directly between each other.

2. The device of claim 1 further comprising a housing surrounding said first and second semiconductor die, said main pad area and a respective portion of each of said pins.

3. The device of claim 1 wherein said at least two pins are arranged along a common edge of said main pad area with said integral pin.

4. The device of claim 3 wherein said lead frame is a T0220 lead frame.

5. The device of claim 1 wherein said first semiconductor die is a MOSFET die having a source, drain and gate electrodes, said one surface that is contact with said main pad area includes said drain electrode and said another surface includes said source and gate electrodes; said source and gate electrodes being connected to respective ones of said at least two pins.

6. The device of claim 5 wherein said second semiconductor die includes a Schottky diode, said one surface that is in contact with said main pad area includes said cathode electrode and said opposite surface includes said anode electrode; said anode electrode being connected to said respective one of said at least two pins that is also connected to said source electrode of said MOSFET; said source electrode and said anode electrode being electrically connected directly to each other by said further electrical connection.

7. The device of claim 6 wherein said lead frame is a T0220 lead frame.

8. The device of claim 1 wherein said further connection between said second electrodes includes a stitch bonded wire.

9. A T0220 package comprising:

a conductive lead frame having a main pad section with at least one integral pin extending from an edge thereof and having at least two pins separated from one another and from said main pad area;

a first semiconductor die comprising an MOS gated semiconductor device having a drain electrode on one surface and a source electrode and a gate electrode on an opposite surface; and a second semiconductor die comprising a Schottky diode having a cathode electrode on one surface and an anode electrode on an opposite surface;

said drain electrode of said MOS gated device and said cathode electrode of said Schottky diode being disposed atop and in electrical contact with said main pad area and being laterally spaced from one another;

said source electrode of said MOS gated device being connected by a wire bond to a respective one of said at least two pins, said anode electrode of said Schottky diode being connected by said respective pin by another wire bond and said gate electrode being wire bonded to another of said at least two pins;

said source electrode and said anode electrode having a further electrical connection directly between each other.

10. The package of claim 9 further comprising a housing surrounding said first and second semiconductor die, said main pad area and a respective portion of each of said pins.

11. The package of claim 9 wherein said MOS gated device is a MOSFET.

12. The package of claim 9 wherein said further electrical connection between said source and said anode electrodes includes a stitch bonded wire.

13. A converter circuit comprising:

a semiconductor device which comprises:

a conductive lead frame having a main pad section with at least one integral pin extending from an edge thereof and having at least two pins separated from one another and from said main pad area, a first semiconductor die comprising a first MOS gated semiconductor device having a drain electrode on one surface and a source electrode and a gate electrode on an opposite surface, and a second semiconductor die comprising a Schottky diode having a cathode electrode on one surface and an anode electrode on an opposite surface, said drain electrode of said first MOS gated device and said cathode electrode of said Schottky diode being disposed atop and in electrical contact with said main pad area and being laterally spaced from one another, said source electrode of said MOS gated device being connected by a wire bond to a respective one of said at least two pins, said anode electrode of said Schottky diode being connected by said respective pin by another wire bond and said gate electrode being wire bonded to another of said at least two pins;

said source electrode and said anode electrode having a further electrical connection directly between each other;

a second MOS gated device having a drain electrically coupled to a supply voltage terminal and a source terminal electrically coupled to said drain terminal said first MOS gated device and to said cathode terminal of said Schottky diode; said source terminal of said first MOS gated device and said anode terminal of said Schottky diode being electrically coupled to a ground terminal; and a controller coupled to each of said gate terminals of said first and second MOS gated devices.

14. The converter circuit of claim 13 wherein said semiconductor device is housed in a T0220 device package.

15. A semiconductor device comprising:

a conductive lead frame having a main pad section with at least one integral pin extending from an edge thereof and having at least two pins separated from one another and from said main pad area;

a first semiconductor die having a first electrode on one surface and at least a second electrode on an opposite surface; and a second semiconductor die having a first electrode on one surface and at least a second electrode on an opposite surface;

said first electrodes of said first and second die being disposed atop and in electrical contact with said main pad area and being laterally spaced from one another;

said second electrode of said first die being connected by a first wire bond to a respective one of said at least two pins, and said second electrode of said second die being connected to said respective pin by a second wire bond;

said second electrode of said first die being further electrically connected to said second electrode of said second die by a third wire bond that is redundant with said first and second wire bonds.

16. The device of claim 15 wherein said first semiconductor die is a MOSFET die having a source, drain and gate electrodes, said one surface that is contact with said main pad area includes said drain electrode and said another surface includes said source and gate electrodes; said source electrode being connected to said respective pin by said first wire bond and said gate electrode being connected to another of said at least two pins by a fourth wire bond.

17. The device of claim 16 wherein said second semiconductor die includes a Schottky diode, said one surface that is in contact with said main pad area includes said cathode electrode and said opposite surface includes said anode electrode; said anode electrode being connected to said respective one of said at least two pins that is also connected to said source electrode of said MOSFET by said second wire bond; said source electrode and said anode electrode being further redundantly connected directly to each other by said third wire bond.

18. The device of claim 15 wherein said third wire bond includes a stitch bonded wire.

* * * * *